United States Patent [19]
Harford

[11] 4,365,208
[45] Dec. 21, 1982

[54] GAIN-CONTROLLED AMPLIFIER USING A CONTROLLABLE ALTERNATING-CURRENT RESISTANCE

[75] Inventor: Jack R. Harford, Flemington, N.J.

[73] Assignee: RCA Corporation, New York, N.Y.

[21] Appl. No.: 143,033

[22] Filed: Apr. 23, 1980

[51] Int. Cl.³ .................... H03G 3/18; H03F 3/14; H03F 3/45
[52] U.S. Cl. ................................ 330/278; 330/307; 330/254
[58] Field of Search .............. 330/254, 283, 278, 284, 330/307; 357/34, 51, 37

[56] References Cited

U.S. PATENT DOCUMENTS

| | | | |
|---|---|---|---|
| 3,374,404 | 3/1968 | Luecke | 317/234 |
| 3,571,674 | 3/1971 | Yu et al. | 317/235 |
| 3,858,234 | 12/1974 | Olson | 357/34 |
| 3,942,181 | 3/1976 | Berrod et al. | 343/16 M |
| 3,976,951 | 8/1976 | Ishigaki et al. | 330/29 |
| 4,032,958 | 6/1977 | Yagi et al. | 357/37 |
| 4,131,809 | 12/1978 | Baars | 307/303 |

FOREIGN PATENT DOCUMENTS 1472113 of 0000 United Kingdom .
2044565 of 0000 United Kingdom .

OTHER PUBLICATIONS

Wolf, Helmut, *Silicon Semiconductor Data*, 1976, pp. 500–516.
Schatter, E., "Monolithic TV IF System TBA 440", IEEE Trans. on BTR, vol. BTR-18, No. 3, Aug. 1972.
Kuno, H. J., "Analysis and Characterization of P-N Junction Diode Switching", *IEEE Trans. on Electron Devices*, Jan. 1964.
"Temperature Dependence of Storage Time in Silicon P+-N-N+ Switching Diodes and Reduction of Harmonics Distortion" by Rosen, A., Martinelli, R., Caulton, M.
*Electronic Letters*, Jan. 17, 1980, vol. 16, No. 2.

*Primary Examiner*—James B. Mullins
*Assistant Examiner*—Gene Wan
*Attorney, Agent, or Firm*—Eugene M. Whitacre; Paul J. Rasmussen; Ronald H. Kurdyla

[57] ABSTRACT

A gain-controlled amplifier is provided which employs a controllable alternating-current resistance device. The device is constructed in a similar manner as a vertical PNP transistor, having an emitter region of high conductivity P+ material, a P type collector region, and an intervening region of high resistivity (intrinsic) N type base material. An N+ base contact region is separated from the P+ emitter region by an expanse of the intrinsic material which establishes a separation which is greater than the diffusion length of carriers injected into the intrinsic region. The base-emitter junction of the device which is formed by the N+ base contact region, the intrinsic region, and the P+ emitter region thus has the characteristics of a PIN diode, with a high injected carrier lifetime. At higher signal frequencies, such as the frequencies of television I.F. signals, the base-emitter PIN junction ceases to act as a normal transistor rectifying junction, and becomes an A.C. resistance which varies as a function of the number of injected carriers. Carriers are injected into the intrinsic region from the P+ emitter region, and vary as a function of the magnitude of the emitter-to-collector control current. Only a very small base current component of the applied control current flows in the base-emitter junction, and therefore only this small base current component is applied to the amplifier which is coupled to the base of the device. With the high carrier lifetime and operation at higher signal frequencies, the A.C. resistance of the base-emitter junction is virtually completely a function of the magnitude of the control current.

10 Claims, 5 Drawing Figures

GAIN-CONTROLLED AMPLIFIER USING A CONTROLLABLE ALTERNATING-CURRENT RESISTANCE

This invention relates to a gain-controlled amplifier which uses a semiconductor device which exhibits a controllable alternating-current (A.C.) resistance.

When an A.C. signal is to be processed, it is often desirable to amplify it in a controllable manner. For instance, the intermediate frequency (I.F.) amplifier in a television receiver is generally designed to produce a constant level output signal (relative to a signal reference level) for use by a subsequent demodulator. This is accomplished by utilizing an automatic gain control signal to vary the gain of the amplifier as a function of the level of the incoming signal.

The gain of the amplifier may be controlled in a number of ways which may generally be classified as either transconductance modulation or impedance variation. Transconductance modulation includes the common technique of reverse bias gain control, whereby the characteristic of a transistor is advantageously used to vary the transconductance, or $g_m$, of the device. Impedance variation includes such techniques as forward AGC, collector load modulation, or emitter degeneration control of a common emitter transistor amplifier, whereby the input and output impedances of the transistor are varied in relation to each other. In the latter case of impedance modulation, it is desirable to utilize a device, the impedance of which can be readily controlled, and, for many applications, a device which readily lends itself to manufacture in integrated circuit form.

Such a device is described in IEEE Transactions on Broadcast and Television Receivers, August, 1972, pages 158–62, in which a variable resistor is formed by a pair of NPN transistors. The transistors are coupled between the emitters of differential amplifier coupled transistors. A variable control current is applied to the bases of the NPN transistors to vary the A.C. resistance of the NPN transistors, which are driven into varying degrees of saturation depending upon the required gain of the differential amplifier. However, when the control current is reduced to decrease the gain of the amplifier in the presence of high level input signals, the signal currents are high as the control current is reduced. The A.C. resistance of the NPN transistors is then no longer solely a function of the control current, but is modulated by the signal current. The NPN transistors will then develop signal distortion and cross-modulation of the signals at the emitters of the differential amplifier transistors. Moreover, the saturation current of the NPN transistors is applied to the emitters of the differential amplifier transistors, which will vary the D.C. bias of the amplifier as the gain of the amplifier is varied.

An improved configuration of the above-described arrangement is shown in U.S. Pat. No. 4,131,809 to Baars, in which a balanced ladder of distributed diodes and resistors is coupled between the emitters of differential amplifier-coupled transistors. The A.C. resistance of the ladder network is varied by switching various ones of the distributed diodes in and out of conduction, which changes the number of resistors which are shunted by conducting diodes. However, it has been found that this configuration can develop intermodulation at various points during gain control as various ones of the diodes are switched off, especially when two or more of the amplifiers are cascaded and sequentially gain-controlled. Moreover, the ladder network requires both a bias current and a control current as the control current is varied, the changing difference current between the bias and control currents is applied to the differential amplifier transistors, which changes the D.C. bias of the amplifier. These D.C. bias changes can only be neutralized by a more complex control scheme for the ladder network, in which both the ladder bias and control currents are simultaneously controlled in an offsetting manner.

In accordance with the principles of the present invention, a gain-controlled amplifier is provided which employs a controllable alternating-current resistance device. The device is constructed in a similar manner as a vertical PNP transistor, having an emitter region of high conductivity P+ material, a P type collector region, and an intervening region of high resistivity (intrinsic) N type base material. An N+ base contact region is separated from the P+ emitter region by an expanse of the intrinsic material which establishes a separation which is greater than the diffusion length of carriers injected into the intrinsic region. The base-emitter junction of the device which is formed by the N+ base contact region, the intrinsic region, and the P+ emitter region thus has the characteristics of a PIN diode, with a high injected carrier lifetime. At higher signal frequencies, such as the frequencies of television I.F. signals, the base-emitter PIN junction ceases to act as a normal transistor rectifying junction, and becomes an A.C. resistance which varies as a function of the number of injected carriers. The A. C. resistance of the base-emitter PIN junction is controlled by a control current, which is applied to the emitter of the device. Carriers are injected into the intrinsic region from the P+ emitter region, and vary as a function of the magnitude of the emitter-to-collector control current. Only a very small base current component of the applied control current flows in the base-emitter junction, and therefore only this small base current component is applied to the amplifier which is coupled to the base of the device. With the high carrier lifetime and operation at higher signal frequencies, the A.C. resistance of the base-emitter junction is virtually completely a function of the magnitude of the control current.

It has been found that the above-described device can exhibit parasitic capacitance at the base electrode which can decrease the maximum attainable A.C. impedance of the device. In accordance with a further aspect of the present invention, the P+ emitter region is centered between two N+ base contact regions. The N+ contact regions are electrically connected to each other. In this configuration, intrinsic regions of variable resistivity separate each N+ region from the centered P+ region, and the configuration has been found to increase the range of controlled A.C. resistance without increasing the parasitic capacitance of the device.

Figure 1:
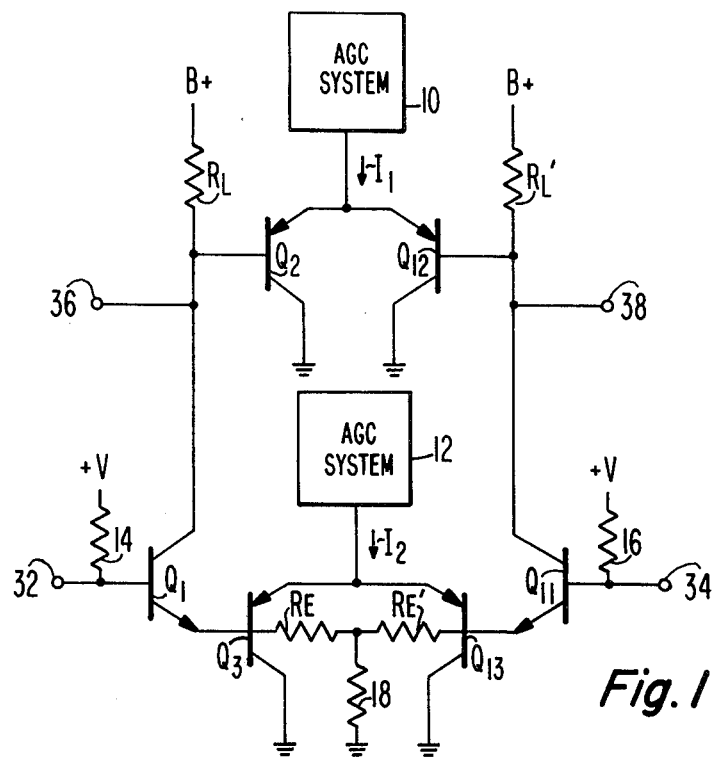
FIG. 1 illustrates, partially in schematic diagram form and partially in block diagram form, a gain-controlled differential amplifier utilizing variable collector and emitter impedances.

Referring to FIG. 1, a differential amplifier is shown, including amplifying transistors $Q_1$ and $Q_{11}$. Input signals are applied between the base electrodes of the amplifying transistors at terminals 32 and 34, and amplified output signals are derived between the collector electrodes of the two transistors at terminals 36 and 38. Base bias for transistors $Q_1$ and $Q_{11}$ is supplied by resistors 14 and 16, which are coupled between the respective base electrodes and a bias voltage source (+V). The emitters of the two amplifying transistors are coupled together by two emitter resistors $R_E$ and $R_E'$. A resistor 18 is coupled between the junction of resistors $R_E$ and $R_E'$ and a point of reference potential (ground).

The emitter electrodes of transistors $Q_1$ and $Q_{11}$ are also coupled to the base electrodes of controlled resistance devices $Q_3$ and $Q_{13}$, respectively. The controlled resistance devices have collector electrodes coupled to ground, and joined emitter electrodes. An AGC system 12 is coupled to the joined emitter electrodes of the controlled resistance devices and supplies a control current $I_2$ to the devices.

Load resistors $R_L$ and $R_L'$ are coupled between the respective collector electrodes of the transistors $Q_1$ and $Q_{11}$ and a source of supply voltage (B+). The collector electrodes of transistors $Q_1$ and $Q_{11}$ are also coupled to the base electrodes of controlled resistance devices $Q_2$ and $Q_{12}$, respectively. The controlled resistance devices have collector electrodes coupled to ground, and joined emitter electrodes. An AGC system 10 is coupled to the joined emitter electrodes of the controlled resistance devices, and supplies a control current $I_1$ to the devices.

The differential amplifier configuration of FIG. 1 is balanced for complementary input signals about the connection of AGC system 10 to the joined emitters of devices $Q_2$ and $Q_{12}$, the connection of AGC system 12 to the joined emitters of devices $Q_3$ and $Q_{13}$, and the junction of resistors $R_E$ and $R_E'$. These junction points will therefore be signal null points for the applied and amplified signals. This balanced configuration results in an effective A.C. collector impedance consisting of the parallel combination of a load resistor ($R_L$ or $R_L'$) and the base-to-emitter resistance of a controlled resistance device ($Q_2$ or $Q_{12}$) for each amplifying transistor. Each parallel combination is connected between the collector electrode of an amplifying transistor and signal reference potential. Likewise, the balanced configuration results in an effective A.C. emitter impedance consisting of the parallel combination of an emitter resistor ($R_E$ or $R_E'$) and the base-to-emitter resistance of a controlled resistance device ($Q_3$ or $Q_{13}$). Each of these parallel combinations is coupled between the emitter electrode of an amplifying transistor and signal reference potential.

A more detailed description of the construction and operation of the arrangement of FIG. 1 may be found in my U.S. patent application Ser. No. 143,034, entitled "GAIN-CONTROLLED AMPLIFIER UTILIZING VARIABLE EMITTER DEGENERATION AND COLLECTOR LOAD IMPEDANCE", which is concurrently filed herewith. Briefly, increasing control current $I_1$ reduces the A.C. base-to-emitter resistance of devices $Q_2$ and $Q_{12}$, which reduces the collector load impedances of transistors $Q_1$ and $Q_{11}$. This reduces the gain of the differential amplifier, as described in my concurrently filed U.S. patent application Ser. No. 143,032, entitled "VARIABLE LOAD IMPEDANCE GAIN-CONTROLLED AMPLIFIER". Increasing control current $I_2$ reduces the A.C. base-to-emitter resistance of devices $Q_3$ and $Q_{13}$, which reduces the impedances in the emitter circuit of transistors $Q_1$ and $Q_{11}$. This increases the gain of the amplifier, as explained in my concurrently filed U.S. patent application Ser. No. 143,035, entitled "VARIABLE EMITTER DEGENERATION GAIN-CONTROLLED AMPLIFIER". Opposite variation of control currents $I_1$ and $I_2$ will have opposite effects on the gain of the amplifier, respectively.

The arrangement of FIG. 1 may be constructed using discrete components, or may be advantageously manufactured in integrated circuit form, with the exception of the AGC systems 10 and 12, which generally require capacitors. The controlled resistance devices are all constructed in the same manner, as shown in FIG. 2, in which the construction of transistor $Q_1$ and controlled resistance device $Q_2$ in integrated circuit form is illustrated.

Figure 2:
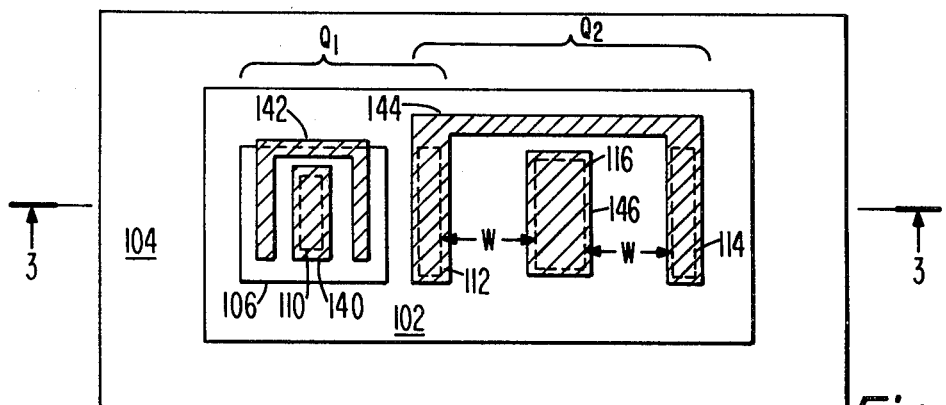
FIG. 2 illustrates a plan view of a controlled resistance device and amplifying transistor constructed in integrated circuit form.

FIG. 2 shows a plan view of an epitaxial boat region 102, which is isolated from neighboring boat regions on an integrated circuit chip by a surrounding isolation diffusion 104. Transistor $Q_1$ includes an emitter region 110, a base region 106, and a collector region comprising the epitaxial material of boat region 102. Metallized conductors 140 and 142 are located on the surface of the integrated circuit, and make electrical contact with the emitter region 110 and the base region 106, respectively, through openings in an intervening layer of insulating material, typically silicon dioxide. (For ease of illustration, the silicon dioxide layer is not shown in FIG. 2 to better illustrate the locations of the underlying diffusion regions.) A diffused region 112 comprises a contact region through which a metallized conductor 144 makes electrical contact with the collector of the transistor.

The controlled resistance device $Q_2$ includes an emitter region 116 and a base region comprising the epitaxial material of region 102. The underlying semiconductor substrate comprises the collector electrode of the device. A metallized conductor 146 makes electrical contact with the emitter region 116, and metallized conductor 144 connects base contact regions 112 and 114. The contact region 112 is seen to provide contact to both the collector of $Q_1$ and the base of $Q_2$, since the collector and base regions of the two devices both are comprised of the epitaxial material of region 102. The base contact regions 112 and 114 of device $Q_2$ are disposed on either side of the emitter region 116, separated by expanses w of epitaxial material. It is this separation w of relatively intrinsic (high resistivity) epitaxial material which gives the $Q_2$ device its base-emitter PIN diode characteristic.

The range of controlled resistance of the base-emitter junction is a function of the conductivity properties of the regions 112, 114, 116 and the intrinsic property of region 102. Once these properties have been fixed in accordance with the constraints of a particular integrated circuit manufacturing process, the controlled resistance range can be extended or reduced only by changing the dimensions and spacing of the regions. For example, the junction formed by regions 112, 102 and 116 is sufficient to give device $Q_2$ its PIN diode characteristic without the use of region 114. However, the controllable resistance range of this configuration is less than the range of the device which includes region 114. To expand the range of the device which excludes region 114, it is necessary, for example, to increase the lengthwise dimensions of regions 112 and 116. However, this increase in length causes the base-emitter junction to have increased parasitic capacitance, which limits the high impedance end of the variable resistance range. The effect of the addition of region 114 is to increase the area of intrinsic material between the emitter region 116 and the base contact regions 112 and 114, and hence the controlled resistance range, of the base-emitter junction, but without the additional parasitic capacitance that would result from lengthening the emitter region 116 and the contact region 112.

Since the epitaxial base region of device $Q_2$ and the epitaxial collector region of transistor $Q_1$ are connected to each other, the devices can both be located in the collector boat region of transistor $Q_1$. Because they share the same boat, $Q_1$ and $Q_2$ can be located immediately adjacent to each other and are seen to share the same contact region 112 for the $Q_1$ collector and the $Q_2$ base. The close proximity of the two devices in the same boat region reduces the parasitic collector-to-substrate capacitance at the collector of $Q_1$, which would otherwise result from the use of separate, connected boat regions for $Q_1$ and $Q_2$. A large parasitic capacitance at the collector of the transistor would tend to limit the bandwidth of the amplifier; the close proximity of the devices $Q_1$ and $Q_2$ thus provides an improved gain-bandwidth characteristic for the amplifier, since a higher value collector load resistor $R_L$ can then be used without suffering the bandwidth reduction resulting from a larger parasitic capacitance shunting the resistor. The value of the load resistor and parasitic capacitance determines the extend of the upper end of the gain control range of the amplifier; the higher the collector load impedance, the greater the gain and the range of possible gain control. The reduced parasitic capacitance of the amplifier thus permits a wider range of gain control for the amplifying transistor.

The reasons for desiring reduced parasitic capacitance at the junction of the collector of $Q_1$ and $Q_2$ do not apply with equal weight to the junction of the emitter of $Q_1$ and the base of $Q_3$ of FIG. 1. This is because the emitter impedance of $Q_1$ is usually lower than the collector impedance. In particular, $R_E$ is generally a lower value resistor than $R_L$. The impedance of the parasitic capacitance at the emitter of $Q_1$ has less an effect on the lower value emitter impedance, and is less a concern at the emitter of $Q_1$. This is advantageous in the illustrated arrangement, since it is necessary to locate $Q_3$ in a separate epitaxial boat from transistor $Q_1$. Connection between the base of $Q_3$ and the emitter region 110 of transistor $Q_1$ is then made by extending metallized conductor 140 to the base contact region of the $Q_3$ device.

Figure 3:
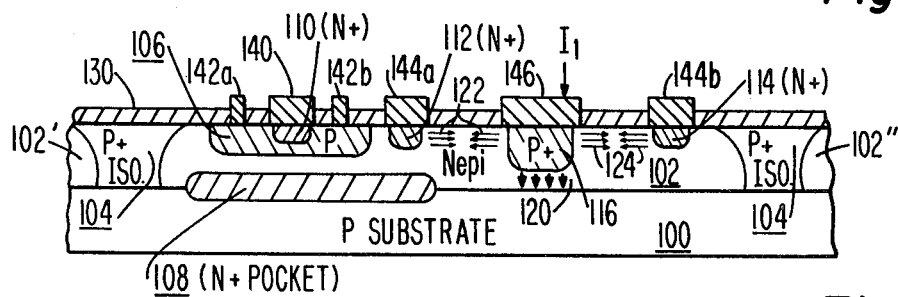
FIG. 3 illustrates a cross-sectional view of the device of FIG. 2.

A cross-sectional view of the integrated circuit of FIG. 2 is shown in FIG. 3, in which identical semiconductor regions bear the same reference numerals. A substrate 100 of P type material contains surface layer 102′, 102, 102″ of N type high resistivity epitaxial material. The epitaxial layer is divided into separate boat regions 102′, 102 and 102″ by P+ type isolation diffusions 104. A buried pocket 108 of N+ type material is located beneath transistor $Q_1$ at the interface of the epitaxial layer and the substrate. The P type base region 106 of transistor $Q_1$ is located at the surface of the epitaxial layer, and an N+ type emitter region 110 is located in the base region 106. Metallized conductor 140 contacts the surface of the emitter region 110 through a hole in an insulating layer 130 of silicon dioxide, and metallized conductors 142a and 142b contact the surface of the base region 106.

An N+ type contact region 112 is also located over the buried pocket 108 at the surface of the epitaxial layer to make electrical contact with the epitaxial material 102, which forms the collector of transistor $Q_1$ and the base of device $Q_2$. A second N+ type contact region 114 is laterally located from the first contact region to make electrical contact with the epitaxial base region of the $Q_2$ device. Metallized conductors 144a and 144b make contact with regions 112 and 114, respectively, at the surface of the epitaxial layer.

The P+ type emitter region of device $Q_2$ is centered between base contact regions 112 and 114. A metallized conductor 146 makes contact with the emitter region 116 at the surface of the epitaxial layer. The P type substrate forms the collector of the $Q_2$ device.

The N+ buried pocket underlying transistor $Q_1$ improves the conductivity of the transistor by reducing the resistance of the collector current path between the emitter and base regions 110 and 106 and the collector contact region 112 of the transistor. No pocket underlies device $Q_2$, however, since the conductivity of the epitaxial layer is to be maintained as low as possible, and is to be controllably increased only by resistivity modulation resulting from the flow of injected carriers into the epitaxial layer from the P+ emitter region 116 and the N+ base contact region 112 and 114.

Control current for the device $Q_2$ is applied to metallized conductor 146, and establishes an emitter-to-collector current flow in the device from the P+ emitter region to the substrate collector, as indicated by arrows 120. The control current which is applied to the P+ emitter region establishes a forward bias across the emitter-to-base region of $Q_2$, including the P+ emitter region 116, the epitaxial base region 102, and the N+ base contact regions 112 and 114. The forward bias causes carrier injection into the epitaxial region 102. Electrons are injected into the epitaxial layer 102 from the N+ regions 112 and 114, and holes are injected from the P+ region 116. These carriers diffuse into the epitaxial layer as indicated by arrows 122 and 124, their concentrations diminishing with depth into the epitaxial layer because of recombination. The injected carriers modify the conductivity of the region of epitaxial material which separates the P+ and N+ regions; in this way, the density of the carriers is used to control the resistivity of the epitaxial layer of the emitter-base junction, and the resistivity drops as the forward bias and the injected carrier density increase. Conversely, as the forward bias is reduced toward zero, the stored charge density declines, and the resistance of the emitter-base junction increases. At zero bias, the impedance of the emitter-base junction reaches its maximum value, which is limited by the junction capacitance of the device. Hence, at zero bias, the base-emitter junction becomes a capacitor. The value of the capacitance is low, due to the wide separation of the P+ and N+ regions by the intervening epitaxial layer.

Once a given forward bias has been established across the base-emitter junction of $Q_2$, a steady-state condition will be determined. In the steady state, the D.C. emitter-to-base current will be substantially only the current needed to replace the carriers lost by recombination. There are three major recombination mechanisms in the emitter-base junction: bulk recombination of carriers with impurities in the epitaxial layer, surface recombination at the upper and lower epitaxial layer boundaries, and an interfacial recombination at the interface of the epitaxial region and the N+ regions. The average time required for the carriers to recombine is defined as the carrier lifetime $\tau$. The charge continuity equation for the emitter-base junction may thus be expressed as:

$$I = dQ/dt + Q/\tau \tag{1}$$

where I is the forward bias current, $dQ/dt$ is the stored charge resulting from injected carriers which have not yet recombined, and $Q/\tau$ is the recombination rate.

The forward bias current I of equation (1) consists of both a D.C. term and an A.C. term, the latter term being a function of the A.C. signal which is applied to $Q_2$, such as that which is supplied by $Q_1$ in FIG. 1. The total current I is then expressed as:

$$I = I_{D.C.} + I_{A.C.} \cos \omega t \tag{2}$$

where $\omega$ is the frequency of the applied signal in radians per second. From the definition of conductance G and electron and hole mobilities $\mu_e$ and $\mu_h$, it is found from equation (2) that the conductance of the epitaxial layer of the device is given by the expression:

$$G = \frac{I_{D.C.}(\mu_e + \mu_h)\tau}{w^2} + \frac{I_{A.C.}(\mu_e + \mu_h)\tau \cos(\omega t + \phi)}{w^2 \sqrt{\{1 + (\omega\tau)^2\}}} \tag{3}$$

where w is the length of the epitaxial layer which separates the N+ and P+ regions of $Q_2$.

It is desirable to make the resistivity (which is the inverse of the conductance G) of the $Q_2$ device dependent primarily upon the D.C. bias current, and relatively independent of the A.C. current. In the right-hand side of equation (3), the first term is the D.C. term, and the second term is the A.C. term. If the A.C. term is a significant contributor to the total conductance (e.g., is greater than twenty percent of the D.C. term), the resistivity of the $Q_2$ device will be A.C. modulated, varying as a function of the frequency of the A.C. signal $\cos(\omega t + \phi)$ which is applied to the device. This A.C. modulation of the resistivity will cause undesirable harmonic distortion in the A.C. signals which are applied to $Q_2$. When the D.C. term predominates, the conductance of the device, and hence its resistance, is primarily D.C. dependent, and will not vary significantly with time as a function of the applied A.C. signal.

It may be seen that the A.C. term of equation (3) will be reduced in significance when $\omega t$ in the denominator of the A.C. term is much greater than one. If $\omega t$ is significantly greater than one, the denominator of the A.C. term reduces to $$w^2 \omega \tau. \tag{4}$$

The denominator of the A.C. term is now seen to be greater than the denominator of the D.C. term ($w^2$) by the factor $\omega\tau$, and the significance of the A.C. term is reduced by increasing the factor $\omega\tau$.

Another way of analyzing equation (3) is to state the desired inequality

D.C. Term > A.C. Term. (5)

This inequality may be simplified for equation (3) by using expression (4) as the denominator of the A.C. term, cancelling the $\tau$ terms which appear in both the numerator and the denominator of the A.C. term, and omitting the terms $(\mu_e + \mu_h)$ and $w^2$ which appear in the same respective positions in the two terms. With $I_{A.C.}$ representing a time-varying A.C. current, the time-varying function $\cos(\omega t + \phi)$ may also be neglected, and inequality (5) may be expressed as $$I_{D.C.}\tau > I_{A.C.}/2\pi f \tag{6}$$

where f is the frequency of the applied A.C. signal and $2\pi f = \omega$.

Inequality (6) will be satisfied in general when $\tau$ is much greater than $\frac{1}{2}\pi f$. In addition, if $I_{D.C.}$ is greater than $I_{A.C.}$, the inequality is further substantiated. It is noted that when $\tau$ is much greater than $\frac{1}{2}\pi f$, $\omega\tau$ is necessarily much greater than one, which is the same result obtained above.

Figure 4:
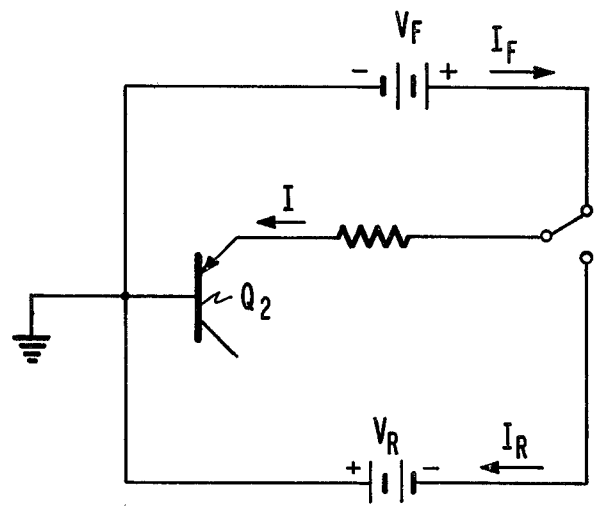
FIG. 4 is a schematic representation of a test set-up for the device of FIGS. 2 and 3.

The carrier lifetime $\tau$ of the above expressions may easily be found from an empirical measurement of the reverse-recovery storage time, $t_s$ of any $Q_2$-type device. A test circuit for making this measurement is shown in FIG. 4. In making this measurement, the emitter-base junction of $Q_2$ is forward biased by a current $I_F$ until a steady state condition exists. The current is then quickly reversed to a value $I_R$. Immediately after reversing, current $I_R$ is maintained at the emitter of $Q_2$ by a flow of stored charge back to the emitter region from the epitaxial region. However, during this initial period, the carrier density at the P+ and epitaxial layer junction is dropping, and it continues to drop for a period of time defined as the storage time, $t_s$.

Figure 5:
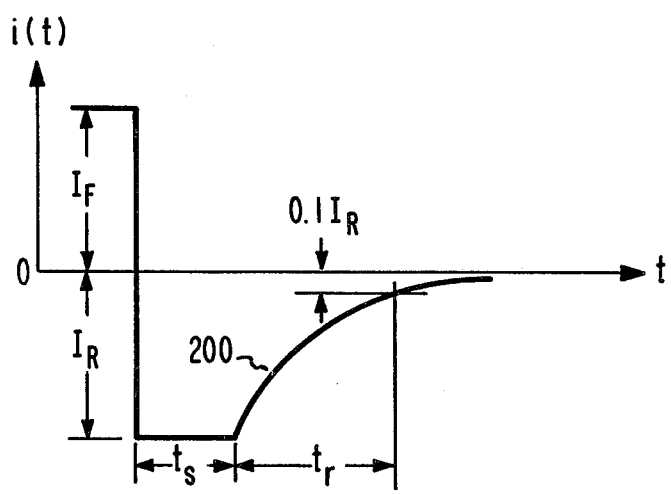
FIG. 5 illustrates a current waveform of the test set-up of FIG. 4.

When the carrier density at the interface of the P+ region and the epitaxial layer reaches zero at time $t_s$, a reverse-bias depletion layer begins to form. With the carrier density at the junction equal to zero, the reverse current $I_R$ can no longer be supported, and the voltage across the junction builds up rapidly toward a reverse bias steady state condition. The voltage buildup is retarded by the time required to charge up the depletion capacitance and to extract the remainder of the carriers previously injected into the epitaxial layer under forward bias. The time required for the voltage to build up to ninety percent of its reverse bias steady state condition is defined as the recovery time $t_r$. The current in $Q_2$ is represented by waveform 200 of FIG. 5. The relation between the storage time $t_s$ and the carrier lifetime $\tau$ is $$t_s/\tau = \ln[1 + (I_F/I_R)]. \tag{7}$$

when $I_F$ equals $I_R$, this equation reduces to:

$$\tau = 1.44 t_s. \tag{8}$$

A $Q_2$-type device was constructed as shown in FIGS. 2 and 3, having a spacing w of $20\mu$ and an epitaxial layer resistivity of 1.5Ω-cm. The carrier lifetime $\tau$ of the device was measured using the reverse recovery technique described above. For equal forward and reverse bias currents of 3 ma., a storage time $t_s$ of 45 nsec. was obtained. Using equation (8), the carrier lifetime $\tau$ was found to be 65 nsec.

The 65 nsec. value for $\tau$ is seen to satisfy the condition necessary to reduce the significance of the A.C. term of equation (3) for typical NTSC television intermediate frequencies of approximately 45 MHz. At this frequency $$\omega\tau = (2.83 \times 10^8 \text{ rad./sec.})(65 \times 10^{-9}) = 18.4$$

which is significantly greater than one. Inequality (6) is likewise satisfied, since $$\tau = 65 \times 10^{-9} \text{ sec.}$$

which is greater than $$\tfrac{1}{2}\pi f = 3.5 \times 10^{-9} \text{ sec.}$$

From these results, it may be seen that the conductivity and therefore the resistivity of the constructed device is almost entirely a function of the D.C. bias current. The mimimal contribution of the A.C. term ensures that substantially no harmonic distortion is created by A.C. modulation of the resistivity of the device.

The spacing w of the epitaxial layer of 20μ in the illustrated example was arrived at by balancing considerations of range of impedance control and A.C. and D.C. current requirements. Increasing the separation w will increase the resistance of the device for a given D.C. bias current. In order to bias the device for low resistance values, greater D.C. bias current is required than would be the case for narrower spacing w, which is usually undesirable. On the other hand, a decreased separation w will result in a lower resistance for a given D.C. bias current. This will cause the device to present a lower resistance to applied A.C. signals, and therefore it will conduct a higher A.C. current, which is also generally undesirable. The 20μ spacing was chosen to permit an order of magnitude of impedance variation for a relatively low D.C. bias current range of zero to 2 ma. The impedances of the range are high enough to cause low A.C. current conduction so that the expression of inequality (6) is further substantiated by a reduced $I_{A.C.}$ as compared with bias current $I_{D.C.}$, as discussed above.

In addition, it is desirable to maintain the spacing w at least equal to, or greater than, the carrier diffusion length of the epitaxial region. The carrier diffusion length is the average distance traveled by the injected carriers before they recombine, and is given by the expression $$L_D\big|_{\text{Min.}} = \sqrt{D\tau}$$

where D is the ambipolar diffusion constant for the epitaxial material. For silicon, D is approximately equal to 26 cm$^2$/sec. For a $\tau$ of 65 nsec., the carrier diffusion length $L_D$ is therefore approximately $13 \times 10^{-4}$ cm. This compares favorable with the 20μ spacing, which is equal to $20.3 \times 10^{-4}$ cm. When w is less than $L_D$, holes injected from the P+ region have a sufficient lifetime during which they will travel across the epitaxial region and recombine at the interface of the epitaxial layer and the N+ region. Likewise, electrons injected from the N+ region will traverse the epitaxial layer separation and recombine at the interface of the epitaxial layer and the P+ region. This increased recombination decreases the amount of stored charge in the epitaxial layer, which reduces the carrier lifetime, $\tau$. With a reduced $\tau$, the $\omega\tau$ term in the A.C. term will decrease, which increases the contribution of the A.C. term to the total conductance of the epitaxial layer. Thus, A.C. modulation of the epitaxial layer resistance increases, causing increased harmonic distortion effects in the applied A.C. signals. Additionally, the buildup of hole concentrations at the interface of the N+ region and the epitaxial region provides increased hole carriers available for recombination with electrons in the N+ region in response to the applied A.C. signals. Increased recombination will cause increased base current flow, and the interface will increasingly perform as a rectifying p-n junction, causing harmonic distortion in the applied signals. By maintaining w greater than $L_D$, interfacial recombination is reduced, and the harmonic distortion performance of the device is accordingly improved.

What is claimed is:

1. A controlled resistance system for use with a signal amplifier, comprising:
   a source of variable control current; and
   a vertical PNP transistor including a base-emitter junction which exhibits a resistance, the magnitude of which is controlled by said control current, said vertical PNP transistor including
   a semiconductor substrate of P type conductivity semiconductor material having a substantially planar surface;
   a first localized region of high resistivity N type semiconductor material located in said substrate adjacent to the surface thereof and exhibiting a given carrier lifetime characteristic;
   a second localized region of P+ type conductivity located in said high resistivity region adjacent to said surface, and coupled to receive control current from said source, wherein control current flow in said P+ type region injects a flow of carriers into said high resistivity region;
   a third localized region of N+ type conductivity located in said high resistivity region and separated from said second localized region by an intervening expanse of said high resistivity N type semiconductor material to establish a separation distance beteen said N+ type and P+ type regions which is at least as great as the penetration depth of said injected carriers at said given carrier lifetime,
   wherein said base-emitter junction includes said N+ type region, said intervening expanse of N type material, and said P+ type region, and the resistance of said base-emitter junction is a function of the density of said injected carriers in said high resistivity region; and
   means for coupling said base-emitter junction of said vertical PNP transistor to said amplifier so that variations in the resistance exhibited by said base-emitter junction render the gain of said amplifier responsive to said resistance variations.

2. A gain-controlled amplifier comprising:
   a source of control current;
   amplifier means including biasing means and an amplifying transistor, said amplifying transistor having base, emitter and collector electrodes and being biased for amplifying alternating current signals occupying a given range of frequencies; said base and emitter electrodes comprising a signal input circuit of said amplifying transistor, and said collector and emitter electrodes comprising a signal output circuit from which amplified signals are provided; and
   a vertical PNP transistor including a base-emitter junction which exhibits a resistance, the magnitude of which is controlled by said control current, including a semiconductor substrate of P type conductivity semiconductor material having a substantially planar surface;

a first localized region of N type semiconductor material having a low concentration of conductivity modifiers, located in said substrate adjacent to the surface thereof, and exhibiting a carrier lifetime which is greater than the period of any one of said frequencies of said given range of frequencies;

a second localized region of P type conductivity located in said first localized region adjacent to said surface, coupled to receive control current from said source, and containing P type conductivity modifiers having a concentration which is greater than said low concentration; and a third localized region of N type conductivity located in said first localized region, coupled to one of said electrodes of said signal output circuit of said amplifying transistor, and separated from said second localized region by an expanse of said first localized region, said third region containing N type conductivity modifiers having a concentration which is greater than said low concentration, wherein said third localized region comprises a base contact region, said base-emitter junction includes said first and second localized regions, and the resistance of said base-emitter junction is a function of the control current applied to said second localized region.

3. The gain-controlled amplifier of claim 2, further comprising a fourth localized region of N type conductivity located in said first localized region and separated from said second localized region by an expanse of said first localized region, said fourth region containing N type conductivity modifiers having a concentration which is greater than said low concentration, wherein said second localized region is located intermediate said third and fourth regions.

4. The gain-controlled amplifier of claim 3, further comprising a low impedance conductor coupled between said third and fourth localized regions, said conductor comprising a base electrode of said vertical PNP transistor.

5. A gain-controlled amplifier comprising;

a source of variable D.C. control current;

a semiconductor substrate of one type conductivity and an epitaxial layer of opposite type conductivity with an interface therebetween, said epitaxial layer having a substantially planar surface;

a first localized region of said opposite type conductivity located in said substrate adjacent to said interface and containing opposite type conductivity modifiers;

a second localized region of said one type conductivity located in said epitaxial layer between said planar surface and said first localized region;

a third localized region of said opposite type conductivity located in said second localized region adjacent to said planar surface and containing opposite type conductivity modifiers, a fourth localized region of said opposite type conductivity located in said epitaxial layer between said planar surface and said first localized region and containing opposite type conductivity modifiers;

wherein said third localized region, said second localized region, and said epitaxial layer respectively comprise emitter, base and collector regions of an amplifying transistor, and said fourth region comprises a collector contact region of said transistor;

means for applying an information signal to one of said base and emitter regions for producing an amplified information signal at said collector contact region; and variable impedance means coupled to said collector region and including a fifth localized region of said one type conductivity located in said epitaxial layer between said planar surface and said substrate and coupled to receive variable D.C. control current from said source, and containing one type conductivity modifiers, said fifth region being separated from said fourth region by an expanse of said epitaxial layer, said received D.C. control current causing an injection of carriers into said epitaxial layer expanse from said fifth region for variably controlling the impedance of said epitaxial layer expanse and the degree of amplification of said information signal.

6. The gain-controlled amplifier of claim 5, further comprising a sixth localized region of said opposite type conductivity located in said epitaxial layer between said planar surface and said substrate, and connected to said fourth localized region by a low impedance conductor, wherein said fifth localized region is located intermediate said fourth and sixth localized regions.

7. The gain-controlled amplifier of claim 5 or 6, wherein said first localized region is located between said substrate and said second, third and fourth localized regions to the exclusion of said fifth localized region.

8. The gain-controlled amplifier of claim 5, wherein said epitaxial layer exhibits a given carrier lifetime for said injected carriers, and said epitaxial layer expanse is at least as great as the distance traveled by said injected carriers during said given lifetime.

9. The gain-controlled amplifier of claim 5, wherein said amplified information signal occupies a given range of frequencies, and wherein said epitaxial layer exhibits a given carrier lifetime for said injection carriers, and the product of said given carrier lifetime and the lowest frequency of said given range of frequencies is greater than one.

10. The gain-controlled amplifier of claim 5, wherein said amplifier information signal occupies a given range of frequencies, and said amplified information signal causes a flow of alternating current in said epitaxial layer expanse having a peak value which is a function of the magnitude of said controlled impedance, wherein said epitaxial layer exhibits a given carrier lifetime for said injected carriers which is greater than one period of the lowest frequency of said given frequency range, and wherein said received D.C. control current has a magnitude which is greater than said peak alternating current value.

* * * * *